(12) United States Patent
Schlösser et al.

(10) Patent No.: US 6,750,098 B2
(45) Date of Patent: Jun. 15, 2004

(54) INTEGRATED SEMICONDUCTOR MEMORY AND FABRICATION METHOD

(75) Inventors: Till Schlösser, Dresden (DE); Dirk Manger, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/619,970

(22) Filed: Jul. 15, 2003

(65) Prior Publication Data

US 2004/0014287 A1 Jan. 22, 2004

(30) Foreign Application Priority Data

Jul. 15, 2002 (DE) .......................... 102 32 002

(51) Int. Cl.[7] ..................... H01L 21/8242; H01L 21/20; H01L 29/76
(52) U.S. Cl. ..................... 438/244; 438/387; 438/195; 257/302; 257/307
(58) Field of Search ................. 257/296–307, 257/903–908; 438/157, 176, 195, 210, 244, 270, 387

(56) References Cited

U.S. PATENT DOCUMENTS

| 5,252,845 | A | * | 10/1993 | Kim et al. ................ 257/302 |
| 6,097,049 | A | * | 8/2000 | Goebel et al. .............. 257/296 |
| 6,521,935 | B2 | * | 2/2003 | Krautschneider et al. ... 257/296 |
| 2002/0071320 | A1 | | 6/2002 | Willer et al. |
| 2002/0096699 | A1 | | 7/2002 | Krautschneider et al. |
| 2002/0127796 | A1 | | 9/2002 | Hofmann et al. |

FOREIGN PATENT DOCUMENTS

| DE | 199 14 496 A1 | 10/2000 |
| DE | 199 29 211 A1 | 1/2001 |
| DE | 101 11 755 C1 | 5/2002 |
| DE | 101 25 967 C1 | 7/2002 |

* cited by examiner

*Primary Examiner*—Caridad Everhart
*Assistant Examiner*—Calvin Lee
(74) *Attorney, Agent, or Firm*—Laurence A. Greenberg; Werner H. Stemer; Ralph E. Locher

(57) ABSTRACT

In semiconductor memories having a surrounding gate configuration, webs, i.e. vertical rectangular pillars made of substrate material, are formed at the surface of a semiconductor substrate and are surrounded by the gate electrodes in a lower region. Conventionally, it is not possible for word lines to make contact with the gate electrodes in the lower region of the webs without at the same time electrically influencing substrate regions at a higher level in the webs or short-circuiting bit lines from their sidewalls, unless complicated methods requiring additional lithography steps are used. A method for the self-aligning, selective contact-connection of the peripheral gate electrodes is performed with the aid of an insulation layer having a smaller layer thickness than the peripheral gate electrodes.

11 Claims, 6 Drawing Sheets

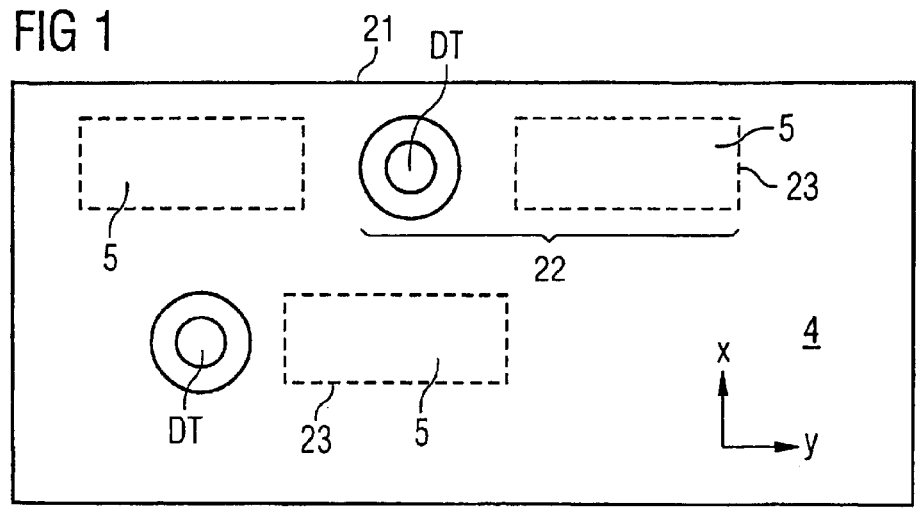
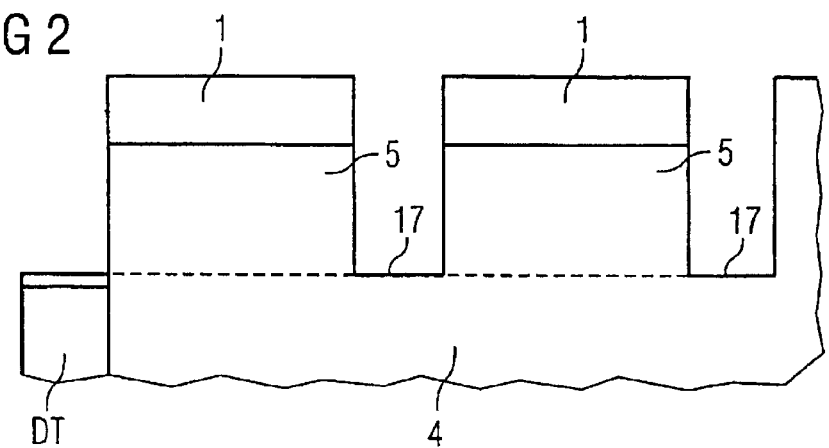
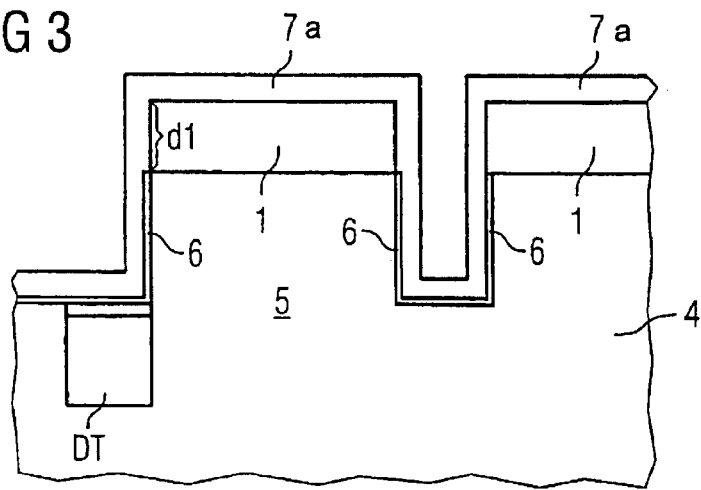

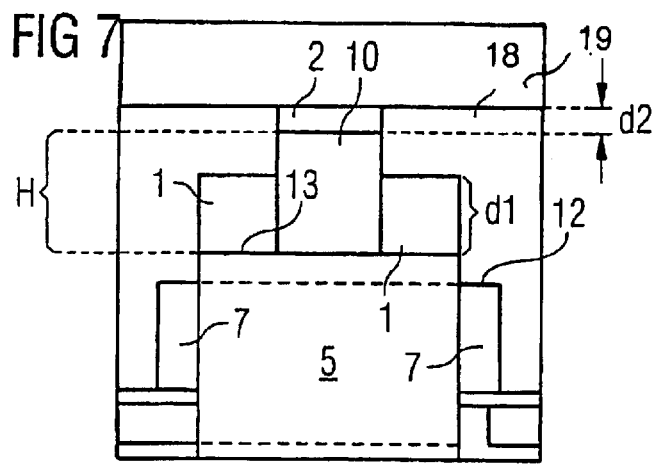
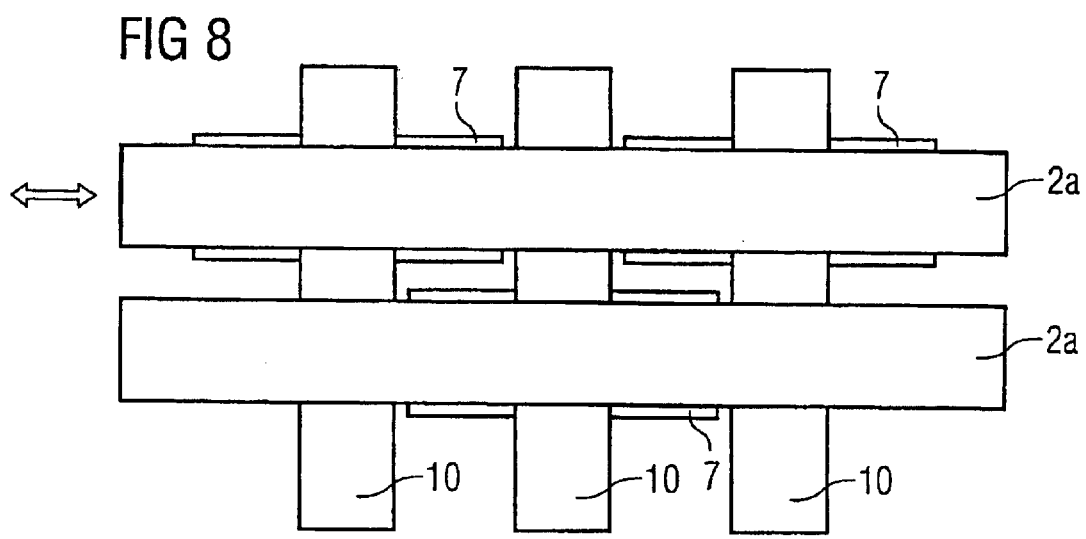
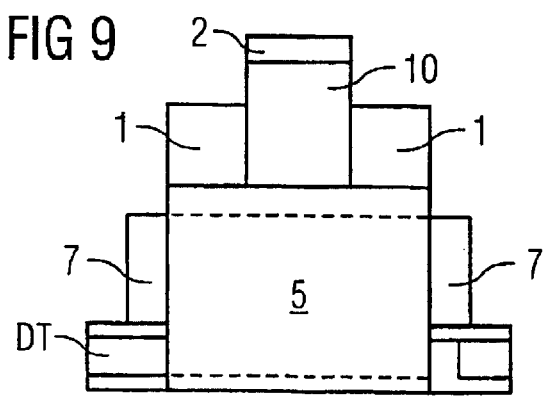

INTEGRATED SEMICONDUCTOR MEMORY AND FABRICATION METHOD

BACKGROUND OF THE INVENTION

Field of the Invention

The invention relates to a method for fabricating an integrated semiconductor memory having memory cells with vertical transistors, which are formed at webs of a semiconductor substrate, and to such an integrated semiconductor memory.

Dynamic integrated semiconductor memories have a cell array with a multiplicity of memory cells each having a storage capacitor (a trench capacitor or a stacked capacitor) and a selection transistor in each case. In order to increase the memory cell density on a semiconductor substrate, vertical transistors are desirable as selection transistors for scaling reasons. In the case of a vertical field-effect transistor (MOSFETs; metal oxide semiconductor field-effect transistor), the channel region runs perpendicularly to the substrate surface.

The vertical selection transistors are often introduced within the trenches for the storage capacitors extending deep into the substrate. In this case, the selection transistors are disposed in an upper region of the trenches and connected to one another parallel to the substrate surface by word lines and bit lines.

In a less widely used configuration of a semiconductor memory, the vertical transistors are disposed outside the trenches, to be precise at webs, that is to say vertical pillars of the substrate material, which are formed by patterning the substrate surface. The patterning gives rise to a two-dimensional configuration of webs that are isolated from one another by trenches in the semiconductor substrate. Each web serves to form a respective selection transistor and is disposed laterally beside the trench of a storage capacitor. An outdiffusion of a doped material that is conductively connected to the inner electrode of the capacitor is produced at one of the four sidewalls of the web. A lower source/drain electrode is thus formed. A gate electrode in the form of a cladding running around all four sidewalls of the web is formed above the lower source/drain electrode. The gate electrode is formed after the production of a gate oxide layer by a conductive material being deposited conformally and isotropically onto the semiconductor substrate, which has been covered with the gate oxide layer and patterned to form webs, and subsequently being etched back anisotropically in a direction perpendicular to the substrate surface, for example by dry etching (RIE; reactive ion etching). This results in a gate electrode that is in the form of a spacer and surrounds an individual web. In the course of the anisotropic etching-back, during which the top side of the web is protected by a first insulation layer, upper regions of the sidewalls of the web are uncovered. The upper source/drain implantations are later introduced in the upper, uncovered region of the webs by a preferably angled implantation. A vertical selection transistor is thus produced in each web.

The selection transistors formed in this way are connected to one another by bit lines and word lines. Gate electrodes are connected to one another by the word lines. Since the gate electrodes are in the form of a spacer having a small layer thickness at the sidewalls of the webs, it is difficult to make contact with them. The gate electrodes that are in the form of spacers and are to be connected by the word lines are situated in a lower region of the sidewalls of the webs. In the course of the gate electrodes being contact-connected by the word lines, it is necessary to bridge a large height difference. At the same time, it is necessary to prevent the substrate material in the upper region of the webs or the bit lines from being contact-connected in the course of the contact-connection of the gate electrodes. Such critical contact-connection can often only be realized with additional patternings, i.e. lithography steps for forming the contacts, and is also problematic because the gate electrodes to be contact-connected have a small layer thickness.

SUMMARY OF THE INVENTION

It is accordingly an object of the invention to provide an integrated semiconductor memory and a fabrication method that overcome the above-mentioned disadvantages of the prior art devices and methods of this general type, in which a semiconductor memory of the above-described configuration can be fabricated without the aid of additional lithographic patterning. Moreover, in the course of the contact-connection of the gate electrodes, the intention is to prevent inadvertent contact-connection of substrate material in the webs above the gate electrode or of bit lines.

Furthermore, the object of the present invention is to provide a semiconductor memory which can be fabricated in this way without additional lithographic patterning and without the risk of a short circuit between the gate electrodes and the substrate material or bit lines.

With the foregoing and other objects in view there is provided, in accordance with the invention, a method for fabricating an integrated semiconductor memory having memory cells with vertical transistors. The method includes the steps of providing a semiconductor substrate, depositing a first insulation layer on the semiconductor substrate, and patterning the semiconductor substrate for producing a configuration of elongate webs extending principally in a first direction and formed from a material of the semiconductor substrate and of the first insulation layer. The elongate webs are laterally isolated from one another by trenches formed in the semiconductor substrate during the patterning. A gate oxide layer is then conformally deposited and gate electrodes are produced running around the elongate webs and disposed at a level of a lower region of sidewalls of the webs on the gate oxide layer. The trenches are filled with a first insulating material, and bit lines are formed above the elongate webs. The bit lines cross the elongate webs perpendicularly to the first direction and are conductively connected to top sides of the elongate webs. At least the top sides of the bit lines are covered with a second insulation layer. A second insulating material is deposited and further trenches are etched for forming word lines. The further trenches run parallel to the first direction, and the gate electrodes are uncovered at least in an upper region due to the etching. An isotropic, conformal deposition process is performed for forming a third insulation layer having a thickness less than a layer thickness of the gate electrodes on the gate oxide layer. The third insulation layer is anisotropic etched perpendicularly to a surface of the semiconductor substrate, thereby uncovering top sides of the gate electrodes. Then, word lines are produced running above the bit lines over the elongate webs parallel to the first direction and making contact with uncovered top sides of the gate electrodes.

According to the invention, an insulation layer which is thinner than the peripheral gate electrodes is produced, so that the gate electrodes project laterally beyond that region of the insulation layer which covers the sidewall above the gate electrodes. This layer thickness difference in the lateral direction enables the gate electrodes to be contact-connected exclusively from their smaller dimension, even though the sidewalls of the spacers are covered by the third insulation layer.

The etching of the third insulation layer directed perpendicularly to the substrate surface does not attack sidewalls of the webs above the gate electrodes and sidewalls of bit lines, but does potentially attack their top sides. However, the latter are protected, according to the invention, by the first and second insulation layers, thus enabling selective uncovering exclusively of the gate electrodes. The gate electrodes can be contact-connected there by the word lines running above the webs and the bit lines. The top sides of the webs and of the bit lines, by contrast, still remain protected.

The method according to the invention has the advantage that it can be combined with a folded bit line concept, in which a memory cell is provided only at every second crossover point between a word line and a bit line; the peripheral spacers that are contact-connected on their top side can be contact-connected without giving rise to a short circuit to the passing bit lines running over them. The method according to the invention and the semiconductor circuit thereby fabricated thus combine the advantages of the folded bit line concept with those of the surrounding gate transistors. Moreover, the word lines connected to the spacers have a sufficiently low electrical resistance. Furthermore, there is no need for additional lithographic patterning (for instance for contact holes) for connecting the transistors to the bit lines.

In a preferred embodiment, it is provided that, the gate oxide layer is covered by the third insulation layer at the sidewalls of the webs above the peripheral gate electrodes. The uncovering of the gate oxide layer at an upper region of the sidewalls of the webs as a consequence of the anisotropic spacer etching-back of the peripheral gate electrodes cannot later lead to an electrical influencing of the upper source/drain electrodes through the gate oxide layer or even short circuits with the word lines since the third insulation layer insulates the two structures from one another.

Therefore, only the peripheral gate electrodes are contact-connected during the formation of the word lines.

It is preferably provided that the first, second and third insulation layers are composed of the same material, and that the layer thicknesses of the first and second insulation layers are chosen to be large enough that the top sides of the semiconductor substrate in the webs and the bit lines remain covered during the etching-back. All three insulation layers are preferably produced on a nitride, preferably made of silicon nitride. If identical materials are chosen, the insulation layers cannot be etched selectively with respect to one another. When the third insulation layer is etched back anisotropically from above, the top sides of the first and second insulation layers are also attacked as soon as the third insulation layer has been etched through. A sufficient layer thickness of the first and second insulation layers prevents uncovering of the bit lines and of the substrate material in the webs at this stage.

It may be provided that the height of the bit lines is chosen to be greater than the layer thickness of the first insulation layer. In this case, the third insulation layer is also deposited on uncovered sidewalls of the bit lines and remains there as protection against an electrical influencing of the upper source/drain potential by the subsequently deposited word line.

It is preferably provided that the gate electrodes running around the webs are formed by an electrically conductive layer being deposited conformally and etched back anisotropically perpendicularly to the surface of the semiconductor substrate, the sidewalls of the webs thereby being uncovered in an upper region of the webs. The application of the spacer technique for forming the peripheral gate electrodes, in conjunction with the smaller layer thickness of the third insulation layer with respect to the gate electrodes, enables contact-connection only of the layer thickness of the gate electrodes that projects beyond the third insulation layer on the gate electrode top side by the word lines.

Bit lines and word lines are preferably produced using the damascene technique. In particular, it is provided that the bit lines are filled in accordance with the damascene technique by filling trenches formed in an insulating material with a conductive material. In the course of this technique, first an insulating layer is deposited over the whole area and trenches for the interconnect to be formed are etched into the insulating layer. The interconnect is subsequently introduced by a conductive layer being deposited over the whole area and then being subjected to chemical mechanical planarization for example.

To facilitate the contact-connection of the top sides of the webs, it is provided that, in order to produce the bit lines, the first insulation layer is etched through to the semiconductor substrate. Dedicated contact holes for the bit lines are not necessary in this case.

In the context of the overall process for fabricating an integrated semiconductor memory, it is provided that, storage capacitors are formed, between which the webs are disposed laterally. Equally, it is provided that, source/drain electrodes are implanted into the sidewalls of the webs above the peripheral gate electrodes.

The lower source/drain electrodes are fabricated by out-diffusion of a buried doped region that proceeds from the inner capacitor electrode. A memory cell is completed in this way.

The object on which the invention is based is furthermore achieved by an integrated semiconductor memory with memory cells with vertical transistors. The semiconductor memory contains a semiconductor substrate having trenches formed therein defining webs having sidewalls and a top-side formed between the trenches, the trenches isolating the webs from each other. A first insulation layer is disposed on the top-side of the webs. An insulating material fills the trenches. A gate oxide layer covers the sidewalls of the webs and gate electrodes run around the webs, disposed on the gate oxide layer and have top sides. The top sides of the gate electrodes are disposed to be deeper than an interface between a material of the semiconductor substrate and the first insulation layer. A second insulation layer is disposed on the gate electrodes and the webs. Word lines are formed above the webs. The word lines make contact with the top sides of the gate electrodes and are isolated from the sidewalls of the webs and sidewalls of the gate electrodes by the second insulation layer.

Other features which are considered as characteristic for the invention are set forth in the appended claims.

Although the invention is illustrated and described herein as embodied in an integrated semiconductor memory and a fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a semiconductor memory according to the invention;

FIGS. 2–4B are diagrammatic, partial sectional views of a manufacturing process for fabricating the semiconductor memory;

FIGS. 6–7 are partial sectional views of the semiconductor memory showing further manufacturing process steps;

FIG. 8 is a plan view of the semiconductor memory during the manufacturing process;

FIGS. 9–12 are partial sectional views of the semiconductor memory showing further manufacturing process steps.

DESCRIPTION OF THE PREFERRED EMBODIMENTS

Figure 4:
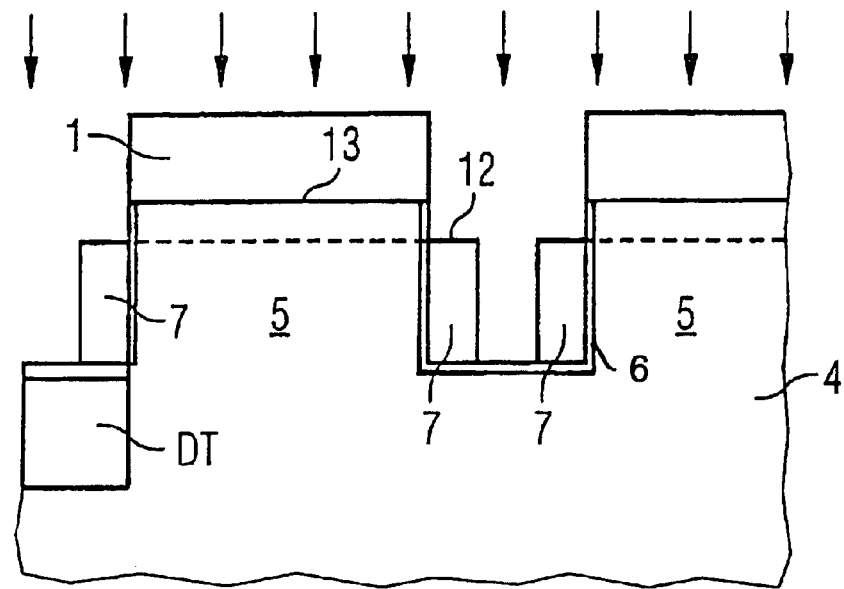

Referring now to the figures of the drawing in detail and first, particularly, to FIG. 1 thereof, there is shown a plan view of a surface of a semiconductor substrate 4, in which storage capacitors DT of a semiconductor memory 21 to be fabricated have already been produced. The storage capacitors DT are buried in the substrate 4 and disposed in such a way that areas for fabricating selection transistors 23 remain between them, the areas being indicated by lines with dashed borders. A selection transistor 23 and a storage capacitor DT respectively together form a memory cell 22 of the semiconductor memory 21 to be fabricated. Before the production of the storage capacitors DT, the structure illustrated in FIG. 1 was covered over area-wide with a first insulation layer 1 preferably made of silicon nitride.

An etching is then performed, in the course of which the first insulation layer 1 and an upper region of the semiconductor substrate 4 are patterned in such a way that material of the entire substrate surface is removed except for zones 23 shown with dashed borders in FIG. 1. This results in webs 5 in accordance with FIG. 2. The web 5 extends above the etched-free substrate area that has been formed by the etching of trenches 17. The trenches 17 surround each individual web 5 laterally from all sides, as can be discerned from the etching plan from FIG. 1. The webs 5 are preferably made elongate and extend principally in a first direction x, but they can also have a square plan. In the case of the structure illustrated in FIG. 2, the fabricated storage capacitors DT are not uncovered; the latter are situated at a deeper level in the substrate; the reference symbol DT in FIG. 2 merely indicates the lateral position of such a capacitor.

The webs 5 produced by the etching form vertical rectangular pillars which project above the surrounding substrate surface and are made of a semiconductor material covered with an insulating nitride layer 1, e.g. with silicon nitride. A vertical selection transistor is to be fabricated in each web. To that end, in accordance with FIG. 3, first a gate oxide layer 6 is produced on the substrate 4 and a layer 7a made of a conductive material, preferably polysilicon, is deposited isotropically. The layer 7a, as illustrated in FIG. 4, is etched back anisotropically in the direction perpendicular to the substrate surface until at least the horizontal layer regions of the layer 7a have been completely removed. After the etching, top sides of remaining gate electrodes 7 made of the polysilicon are situated below the top side of the substrate material in the webs 5.

The anisotropic etching of the layer 7a requires a certain overetch in order that the horizontal layer regions are reliably completely removed. Annular sidewall coverings running around the webs 5 remain and serve as a gate electrode 7 for the vertical selection transistor to be produced. Each annular gate electrode 7 running around a web 5 laterally surrounds the substrate material 4 of the web 5, in which the channel region of the selection transistor is to be formed at the same level as the annular gate electrode 7 and source/drain electrodes are to be formed above and below that. Disposing an upper source/drain zone in the topmost region of a web requires the top sides 12 of the gate electrodes 7 to be situated at a deeper level than the top sides 13 of the substrate material 4 in the webs 5. Therefore, in FIG. 4, the anisotropic etching in the arrow direction perpendicularly to the substrate surface is continued until a sufficient difference in height is achieved between the top side 13 of the substrate material 4 in the webs 5 and the top sides 12 of the annular gate electrodes 7.

Figure 4A:
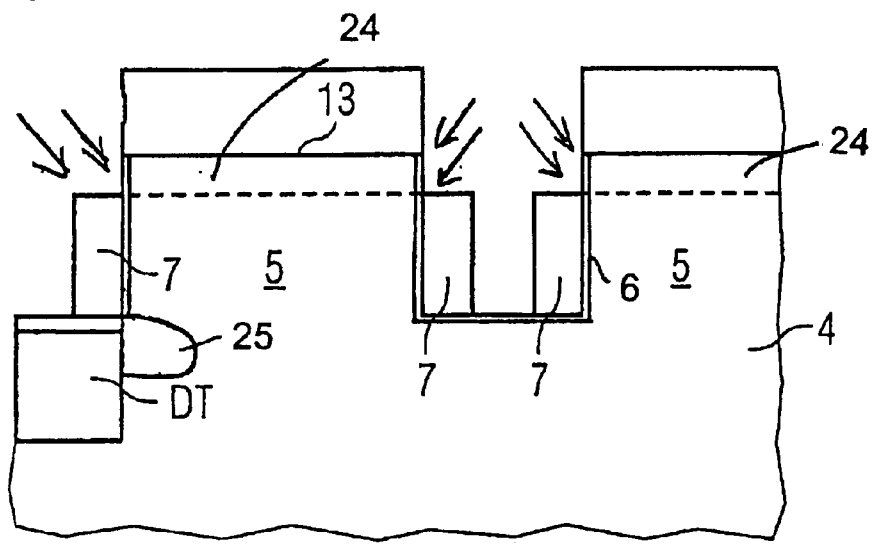

In accordance with FIG. 4A, for example at this point in the method, upper source/drain electrodes 24 are implanted into the topmost part of the substrate material of the webs 5, for example with the aid of an angled implantation. In contrast to lower source/drain electrodes 25 implanted earlier, which are disposed only at the sidewall of a web 5 on the capacitor side, the upper source/drain electrodes 24 extend over the entire lateral web cross-section, but at least over the entire web periphery. The upper source/drain electrodes 24 are contact-connected by bit lines 10 yet to be produced.

Figure 4B:
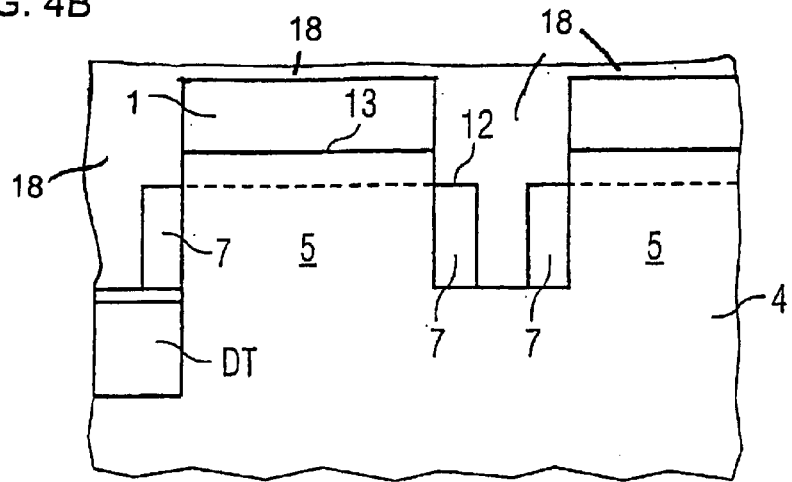

In accordance with FIG. 4B, the trenches 17 are filled with a first insulating material 18, for example an oxide; projecting oxide material can be removed by chemical mechanical polishing to the level of the first insulating material 18. It is noted that the gate oxide layer 6 is no longer illustrated in FIG. 4B.

Figure 5:
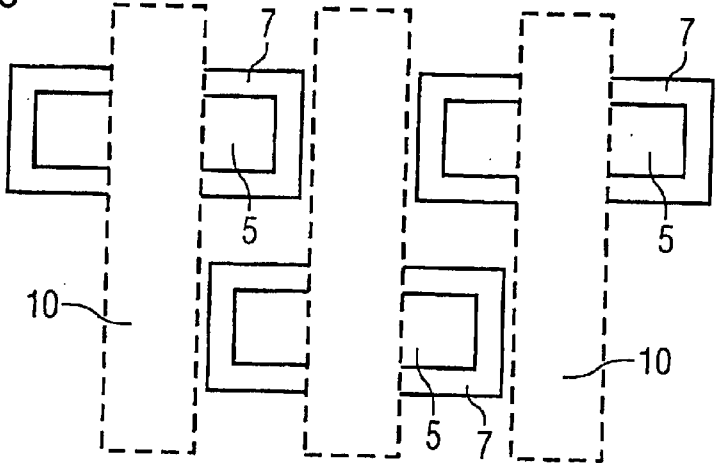
FIG. 5 is a plan view of the semiconductor memory during the manufacturing process.
Figure 6:
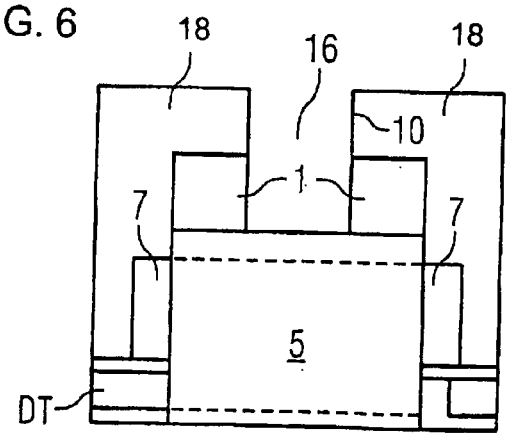

The web 5 which is surrounded by the peripheral gate electrode 7 and is illustrated in cross section along the first direction x in FIGS. 4–4B serves as an initial structure for the vertical selection transistor. FIG. 5 shows a plan view of the structure illustrated in FIG. 4, dashed borders already illustrating the plans of the bit lines 10 that are now to be produced for the connection of the top sides of the webs 5. In order to produce the bit lines 10, as illustrated in FIG. 6, trenches 16 are etched into the material 18 and into the first insulation layer 1, which trenches 16 extend as far as the top side 13 of the substrate material 4 and serve for contact-connecting the source/drain electrodes yet to be implanted. The webs 5 extending in the x direction are crossed by the trenches 16—extending in the y direction—for the bit lines 10 in the manner illustrated in FIG. 5. Apart from the bit line illustrated in FIG. 6, further adjacent bit lines are present which do not make contact with any memory cell in the plane of the drawing (passing bit lines); they run over the trenches for the storage capacitors. The passing bit lines are not illustrated merely for reasons of clarity. The bit line trenches are preferably etched by two etching steps. In the first etching step, an oxide etching selectively with respect to silicon nitride covering the webs 5 is performed, including a brief overetch. The silicon nitride coverings of the webs are uncovered in an upper region in the process. The nitride is removed during a subsequent nitride etching selectively with respect to silicon oxide; the unetched oxide prevents the peripheral spacers from being uncovered.

The bit line 10 made of a conductive material, for example tungsten, tungsten silicide or copper or aluminum, is then produced by a conductive layer or layer sequence made of the materials being deposited over the whole area and then etched back down to interconnects 10 in the trenches 16, a further-reaching, subsequent chemical etching-back also being performed in order to lower top side 11 of the bit lines 10 slightly relative to the top side of the material 18. A second insulation layer 2, which covers the top sides of the lowered bit lines 10, is subsequently deposited. The layer 2 is likewise produced by whole-area deposition and subsequent chemical mechanical planarization.

It may be provided that the bit lines 10 have a larger height H than the first insulation layer 1 (FIG. 7), which initially covers the semiconductor substrate over the whole area before the webs are patterned. With respect to a height d1 of the first insulation layer 1, upper regions of the sidewalls of the bit line 10 are then uncovered as soon as a layer 19 is removed.

Such an etching-back of the layer 19 is necessary in the horizontally running zones illustrated in FIG. 8 in order to produce word lines 20 there. The word lines 20 serve for connecting the gate electrodes 7 to one another (in direction x perpendicular to the course of the bit lines and parallel to the main direction of extent of the webs 5).

In accordance with FIG. 7, a layer made of the second insulating material 19, in which the word lines are to be formed, is deposited.

FIG. 9 shows a section through the structure illustrated in FIG. 8 along the plane of the double arrow, the layer 19 already having been etched back in order to be able to form a word line. The structure illustrated in FIG. 9 contains the webs 5, which are surrounded by the annular gate electrodes 7 and on the top side of which are situated the bit lines 10 covered with the second insulation layer 2 between regions of the first insulation layer 1. The insulating material 19 is not removed above and below the plane of the drawing of FIG. 9, i.e. between the zones with dashed borders in FIG. 8, since no word lines are to be formed there.

Figure 10:
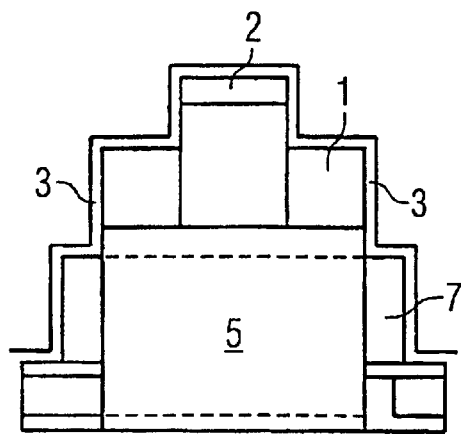
Figure 11:
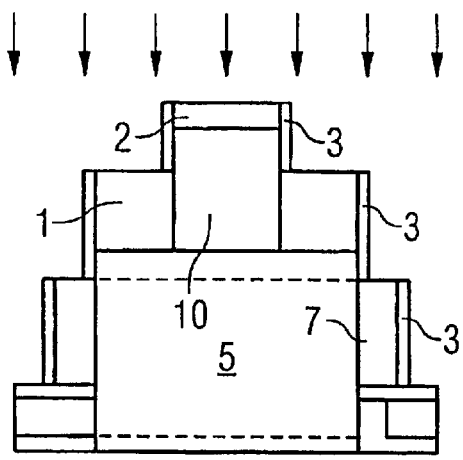

In the case of the structure illustrated in FIG. 9, the peripheral gate electrodes 7 are uncovered on two sides on the left and right of the web 5. However, the gate oxide layer on the sidewalls of the webs 5 is also uncovered and, in the case of bit lines that are higher than the first insulation layer 1, the sidewalls of the bit lines 10 are also partly uncovered. Therefore, no word line can be deposited at this stage since it would lead to a short circuit between the bit line, the gate electrode and the substrate. Instead, in accordance with FIG. 10, first a third insulation layer 3 is deposited over the whole area, isotropically and conformally, the layer thickness thereof being less than the layer thickness of the layer for the gate electrode 7. The third insulation layer 3, which, just like the other two insulation layers, is composed of an insulting material, for example silicon nitride, covers the sidewalls of the substrate material 4 in the webs 5 and the sidewalls of the bit lines 10 but also encloses the gate electrodes 7 from all sides, so that contact-connection is not possible at this time. However, afterward, as illustrated in FIG. 11, the third insulation layer 3 is etched back anisotropically in the direction perpendicular to the substrate surface, thereby uncovering the top sides 12 insofar as they project laterally beyond the layer thickness of the third insulation layer 3 on the sidewalls of the webs 5. The regions of the layer 3 at the sidewalls of the bit lines 10 and of the webs 5 are not removed in the course of the anisotropic etching-back, so that bit lines and webs still remain electrically insulated. The sidewalls of the peripheral gate electrodes 7 also still remain covered by the third insulation layer 3. It suffices to etch back the insulation layer 3 on the gate electrodes 7 from above in order to enable selective contact-connection of the very narrow spacer-type gate electrodes 7 by the word lines 20 now to be produced. This selective contact-connection method is self-aligning and manages without additional complicated process steps, in particular without an additional lithographic patterning. Conventional methods, by contrast, do not permit such simple uncovering exclusively of the narrow gate electrodes 7.

Figure 12:
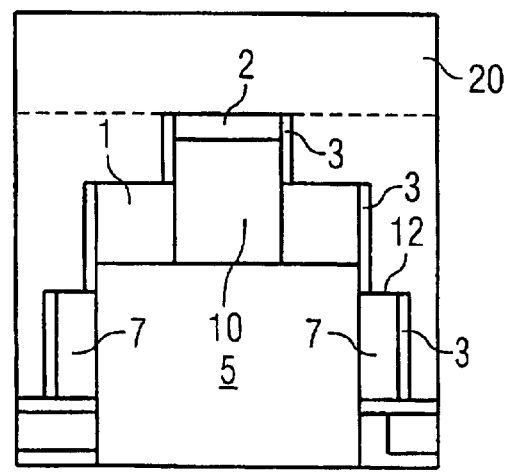
Figure 13:
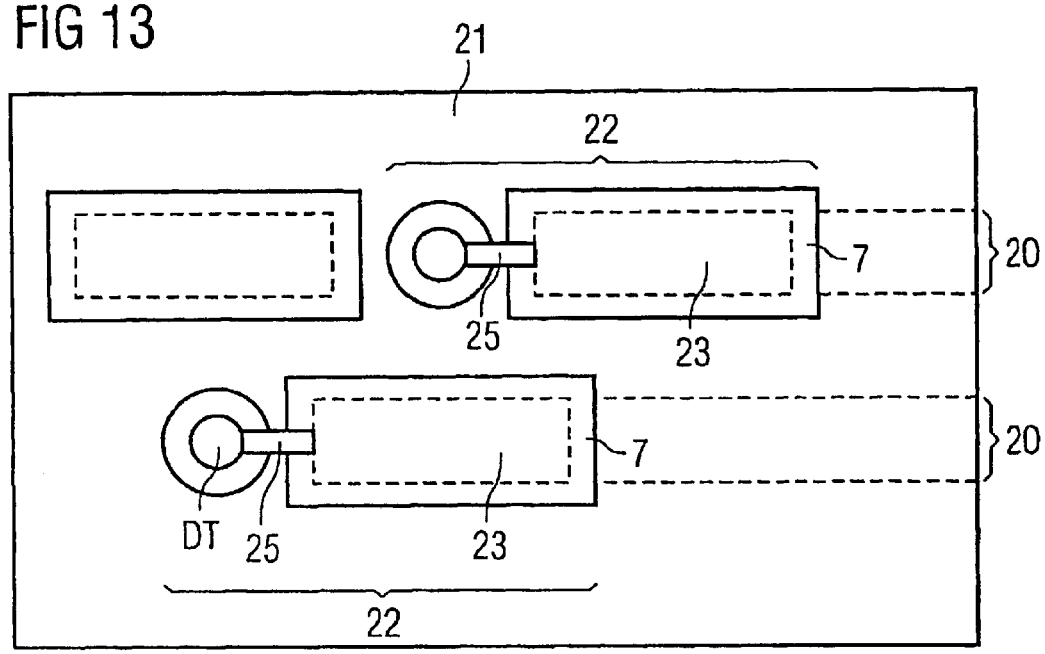
FIG. 13 is a plan view of the semiconductor memory.

A conductive material is then deposited, as illustrated in FIG. 12, over the whole area of the structure illustrated in FIG. 11, which material makes contact with the spacer-type gate electrodes 7 in a lower region and forms the word lines 20 in an upper region, which word lines run from left to right in FIG. 12 above the dashed line in the x direction. In this way, the method according to the invention has achieved selective contact-connection of the deep annular gate electrodes 7 without short-circuiting the sidewall regions of the webs 5 situated at a higher level or the sidewalls of the bit lines 10. The semiconductor memory illustrated in plan in FIG. 13 is produced, the memory cells 22 of the memory each containing a storage capacitor DT and a vertical selection transistor 23. Below the gate electrodes 7 on the sidewall located toward the storage capacitor DT, the selection transistor 23 has the lower source/drain electrode 25 which is formed by outdiffusion from the storage capacitor and via which charges can flow between the transistor and the capacitor.

We claim:

1. A method for fabricating an integrated semiconductor memory having memory cells with vertical transistors, which comprises the steps of:

providing a semiconductor substrate;

depositing a first insulation layer on the semiconductor substrate;

patterning the semiconductor substrate for producing a configuration of elongate webs, extending principally in a first direction, formed from a material of the semiconductor substrate and of the first insulation layer, the elongate webs being laterally isolated from one another by trenches formed in the semiconductor substrate during the patterning;

conformally depositing a gate oxide layer;

producing gate electrodes running around the elongate webs and disposed at a level of a lower region of sidewalls of the webs on the gate oxide layer;

filling the trenches with a first insulating material;

forming bit lines above the elongate webs, the bit lines crossing the elongate webs perpendicularly to the first direction and conductively connected to top sides of the elongate webs;

covering at least top sides of the bit lines with a second insulation layer;

depositing a second insulating material;

etching further trenches for forming word lines, the further trenches running parallel to the first direction, the gate electrodes being uncovered at least in an upper region due to the etching;

using an isotropic, conformal deposition process for forming a third insulation layer having a thickness less than a layer thickness of the gate electrodes on the gate oxide layer;

anisotropic etching the third insulation layer perpendicularly to a surface of the semiconductor substrate, thereby uncovering top sides of the gate electrodes; and producing word lines running above the bit lines over the elongate webs parallel to the first direction and making contact with uncovered top sides of the gate electrodes.

2. The method according to claim 1, which further comprises covering the gate oxide layer with the third insulation layer on the sidewalls of the elongate webs above the gate electrodes.

3. The method according to claim 2, which further comprises:

forming the first insulation layer, the second insulation layer and the third insulation layer from a same material; and setting layer thicknesses of the first insulation layer and of the second insulation layer to be thick enough such that top sides of the semiconductor substrate defining the elongate webs and the bit lines remain covered during the anisotropic etching step.

4. The method according to claim 3, which further comprises forming the first insulation layer, the second insulation layer and the third insulation layer from a material selected from the group consisting of nitrides and silicon nitride.

5. The method according to claim 1, which further comprises:

setting a height of the bit lines to be greater than a layer thickness of the first insulation layer; and depositing the third insulation layer on uncovered sidewalls of the bit lines.

6. The method according to claim 1, which further comprises forming the gate electrodes to run around the elongate webs from an electrically conductive layer being deposited conformally and etched back anisotropically perpendicularly to the surface of the semiconductor substrate, the gate oxide layer thereby being uncovered in an upper region of the elongate webs.

7. The method according to claim 1, which further comprises producing the bit lines using a procedure in which, in accordance with a damascene technique, additional trenches are etched into the first insulation layer and into the first insulating material and are filled with a conductive material.

8. The method according to claim 1, which further comprises producing the bit lines by etching through the first insulation layer to the semiconductor substrate.

9. The method according to claim 1, which further comprises forming storage capacitors between which the elongate webs are disposed laterally.

10. The method according to claim 1, which further comprises implanting source/drain electrodes into the sidewalls of the elongate webs above the gate electrodes.

11. An integrated semiconductor memory having memory cells with vertical transistors, comprising:

a semiconductor substrate having trenches formed therein defining webs having sidewalls and a top-side formed between said trenches, said trenches isolating said webs from each other;

a first insulation layer disposed on said top-side of said webs;

an insulating material filling said trenches;

a gate oxide layer covering said sidewalls of said webs;

gate electrodes running around said webs, disposed on said gate oxide layer and having top sides, said top sides of said gate electrodes disposed to be deeper than an interface between a material of said semiconductor substrate and said first insulation layer;

a second insulation layer disposed above said gate electrodes and said webs; and word lines formed above said webs, said word lines making contact with said top sides of said gate electrodes and isolated from said sidewalls of said webs and sidewalls of said gate electrodes by said second insulation layer.

* * * * *